United States Patent [19]

Frosien et al.

[11] Patent Number: 4,623,836

[45] Date of Patent: Nov. 18, 1986

[54] SAMPLING METHOD FOR FAST POTENTIAL DETERMINATION IN ELECTRON BEAM MENSURATION

[75] Inventors: Jürgen Frosien, Ottobrunn; Burkhard Lischke, Munich, both of Fed. Rep. of Germany

[73] Assignee: Siemens Aktiengesellschaft, Berlin & Munich, Fed. Rep. of Germany

[21] Appl. No.: 693,231

[22] Filed: Jan. 22, 1985

Related U.S. Application Data

[63] Continuation of Ser. No. 382,778, May 27, 1982, abandoned.

[30] Foreign Application Priority Data

Sep. 30, 1981 [DE] Fed. Rep. of Germany ....... 3138992

[51] Int. Cl.⁴ ............................................. G01R 31/28
[52] U.S. Cl. ............................ 324/73 PC; 324/158 R
[58] Field of Search ....................... 324/158 R, 158 D; 250/310

[56] References Cited

U.S. PATENT DOCUMENTS

| | | | |
|---|---|---|---|
| 3,436,651 | 4/1969 | Helms et al. | 324/51 |
| 3,448,377 | 6/1969 | Seiwatz et al. | 324/54 |
| 3,531,716 | 9/1970 | Tarui et al. | 324/158 R |
| 3,549,999 | 12/1970 | Norton | 324/73 R |
| 3,796,947 | 3/1974 | Harrod et al. | 324/51 |
| 4,169,244 | 9/1979 | Plows | 324/73 PC |

OTHER PUBLICATIONS

Balk, L., et al., "Quantitative Voltage Contrast at High Frequencies in the SEM", Scanning Electron Microscopy/1976 (Part IV) Proceedings of the Workshop on Microelectronic Device Fabrication and Quality Control with the SEM (IIT Research Institute, Chicago, Apr. 1976) pp. 615–624.

McGillem et al., "Continuous and Discrete Signal and System Analysis", 1974, pp. 167–170.

Feuerbaum, H. et al., "Quantitative Measurement . . . Electron Microscope," J. Solid State Circuits, vol. SC-13, No. 3, Jun. 1978, pp. 319–325.

Samuel D. Stearns, *Digital Signal Analysis*, New Jersey: Hayden Book Co. Inc., 1975.

Primary Examiner—Reinhard J. Eisenzopf
Assistant Examiner—Stephen M. Baker
Attorney, Agent, or Firm—Hill, Van Santen, Steadman & Simpson

[57] ABSTRACT

A sampling method for potential determination in electron beam mensuration, in which a progression of a periodic signal is to be identified at a measuring point, makes it possible to clearly increase the speed in electron beam potential measurement. The progression of the periodic signal is sampled by the pulsed electron beam repeatedly during a period of the progression of the periodic signal, namely at the specified times $t_1, t_2, \ldots t_n$.

5 Claims, 2 Drawing Figures

SAMPLING METHOD FOR FAST POTENTIAL DETERMINATION IN ELECTRON BEAM MENSURATION

This is a continuation of application Ser. No. 382,778, filed May 27, 1982 now abandoned.

BACKGROUND OF THE INVENTION

1. Field of the Invention

The present invention relates to a sampling method for potential determination in electron beam mensuration in which a periodic signal progression is to be determined at a measuring point.

2. Description of the Prior Art

Measuring the signal progressions within integrated circuits becomes more and more difficult with an increasing degree of integration. Electrical potentials can be imaged at the surface of integrated circuits with the assistance of an electron probe. Most integrated circuits must be dynamically inspected, i.e. they must function with nominal frequency during the investigation.

It is known in the art of potential measurement of chronologically periodic operations, with the assistance of electron beam mensuration that, upon exploitation of the stroboscopy effect, such circuits which operate with nominal frequency during the investigation are imaged quasi-statically in potential contrast. Thereby, a pulsed electron beam is employed which interrogates the circuit potential at a specific measuring point at a fixed time $t_1$ synchronously with the circuit frequency. In order to obtain a high time resolution, the pulse width $\Delta_t$ is thereby small in comparison to the period duration of the circuit signal (stroboscopic illumination). According to the principle of the sampling oscilloscope, a phase point is selected from the periodic measured signal (cut-in time of the electron beam) and the voltage value of the phase point is determined with a secondary electron spectrometry arrangement. By slowly shifting the cut-in time (phase), the signal to be measured is sampled as a function of the phase angle (H. P. Feuerbaum et al, Quantitative Measurement with high resolution of internal waveforms on MOS-RAM's using a modified scanning electron microscope, IEEE J.SC, Vol. SC-13, No. 3 (1978) pp. 319-325, fully incorporated herein by this reference). The disadvantage of this known method is that, because of the short pulse duration of the electron probe, only a small fraction of the current in the electron probe can be used for potential measurement, since the primary electron beam is blanked out for the majority of the time. Long measuring times arise as a result.

SUMMARY OF THE INVENTION

The object of the present invention, therefore, is to provide a sampling method for potential determination in electron beam mensuration of the type generally mentioned above which makes it possible to noticeably increase the speed in the electron beam potential measurement.

The above object is achieved in a sampling method for potential determination in electron beam mensuration, whereby a periodic signal progression is to be measured at a measuring point, the method being characterized in that, during one period of the progression of a periodic signal, the periodic signal progression is repeatedly sampled by the pulsed electron beam, namely at specified times $t_1, t_2 \ldots t_n$.

BRIEF DESCRIPTION OF THE DRAWING

Other objects, features and advantages of the invention, its organization, construction and operation will be best understood from the following detailed description, taken in conjunction with the accompanying drawing, on which.

DESCRIPTION OF THE PREFERRED EMBODIMENTS

Figure 1:
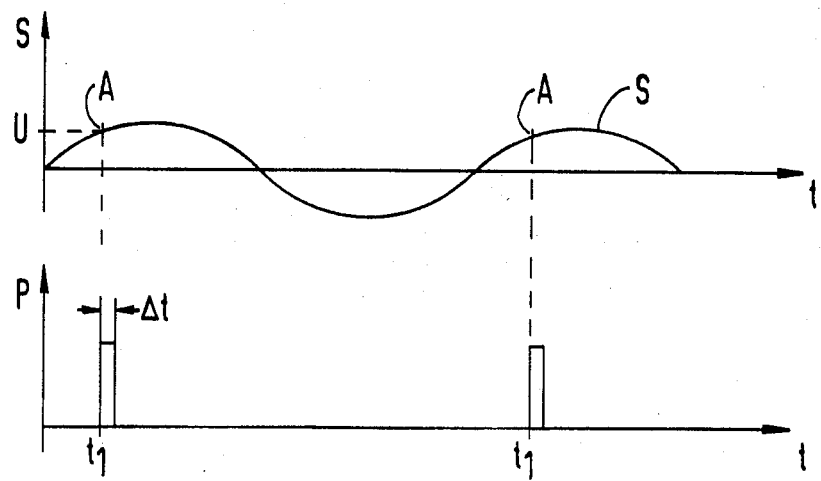
FIG. 1 is a graphic illustration of the principle of a conventional method for sampling a progression of a periodic signal with the assistance of a pulsed electron beam.

FIG. 1 illustrates the principle of a conventional method for sampling a progression of a periodic signal S with the assistance of a pulsed electron beam P. The progression of a periodic signal S and the pulsed electron beam P are entered over the time t. The circuit to be tested with an electron beam measuring installation is cyclically operated and the electron beam is pulsed. According to the principle of the sampling oscilloscope, a phase point A is selected from the progression of a periodic signal S as the cut-in time $t_1$ of the pulsed electron beam P. The voltage value U of the phase point A is determined with the secondary electron spectrometry arrangement of the electron beam measuring installation. In order to obtain a high time resolution, the pulse width $\Delta t$ is small in comparison to the period duration of the periodic signal. By slowly shifting the cut-in time (phase), the progression of a periodic signal to be measured is sampled as a function of the phase angle. The measured result can be recorded either at the oscilloscope or at an x-y recorder. As can be seen from FIG. 1, only a small fraction of the primary electron current in the electron probe can be exploited for measuring the progression of a periodic signal S because of the short pulse duration of the pulsed electron beam P. As is clearly illustrated in FIG. 1, the primary electron beam of the electron beam measuring installation is blanked out for the majority of the time. Long measuring times arise as a result.

Figure 2:
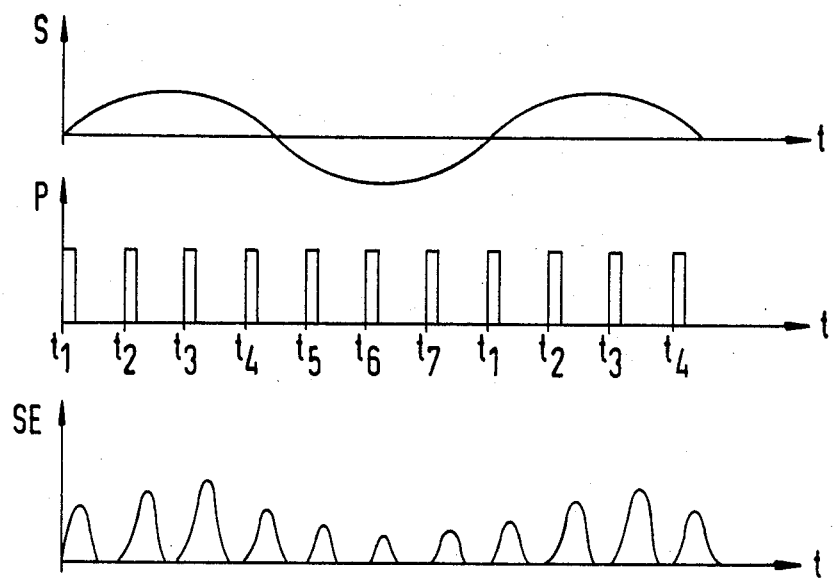
FIG. 2 illustrates, again in a graphic format, the principle of the method of the present invention for sampling the progression of a periodic signal for shortening the measuring time.

FIG. 2 illustrates the principle of the method of the present invention, that is for sampling the progression of a periodic signal S in order to shorten the measuring time. In order to increase the measuring rate, the progression of a periodic signal S at the measuring point of a circuit to be measured is not interrogated just once during the period of the progression of a periodic signal S, but, rather, is repeatedly interrogated at the time $t_1, t_2 \ldots t_n$. In particular, the chronological spacing between two successive sampling times is thereby constant, i.e. $t_{m+1} - t_m = $ constant. In FIG. 2 the periodic signal progression S is sampled seven times during a single period, namely, at the points in time $t_1, t_2 \ldots t_7$. The sub-signals thereby arising are intermediately stored. The minimum spacing of two successive pulses in the pulsed electron beam P is determined by the time behavior of the secondary electron signal SE. Before the start of a new primary electron beam pulse of the pulsed electron beam P, namely, the secondary electron signal SE of the preceding primary electron beam pulse must have decayed. In accordance with the sampling method of the prior art, the chronological voltage progression at the measuring point of the circuit can then be measured as a function of the time t by a phase shift between the phase sequence of the pulsed electron beam P and the periodic signal progression S of the circuit signal. Given the method of the present invention for sampling the progression of a periodic signal S, the phase of the cut-in times $t_1, t_2 \ldots t_n$ need not be shifted over the entire period of the progression of a periodic signal S. When, in particular, the chronological spacings between two respectively successive pulses of the pulse sequence of the pulsed electron beam P is constant, then the phase of the cut-in time of each pulse of a pulse sequence of the pulsed electron beam P must only be shifted over a range of:

The quotient which results from the ratio of the range of the progression, which is to be totally scanned, of a periodic signal to the number of pulses which are utilized for measurement in accordance with the method of the invention for a period of the progression of the periodic signals. In the case of a measuring method according to the state of the art, the phase (switch-on time) of the electron beam must be slowly moved over the entire range of the progression of the periodic signal to be scanned. In the case of a measurement according to the present invention, by contrast, the phase of the switch-on time of each pulse of the pulse train of the pulsed electron beam P need be moved only over a fraction of the entire range of the progression of the periodic signal to be scanned.

Since the progression of a periodic signal S in the sampling method of the present invention is measured piece-by-piece, the individual sub-signals which were separately intermediately stored during the sampling of the progression of a periodic signal S must be read out in the proper sequence so that the complete progression of a periodic signal S arises, being read out after measuring the entire progression of a periodic signal S by shifting the phase of the cut-in times of the pulses of the pulse sequence of the pulsed electron beam P.

According to the method of the present invention, the measuring time, in comparison to the cited prior art, can be reduced by a multiple, namely, by $$\frac{1}{\text{Number of pulses of the pulsed electron beam } P \text{ per period of the progression of a periodic signal}}$$

A method according to the present invention can be realized, for example, with a slightly modified electron beam measuring installation corresponding to the electron beam measuring installation known from the above-cited publication.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a method of sampling a progression of a periodic signal for potential determination of the periodic signal at a measuring point in an integrated circuit, the improvement comprising the steps of:

during one period of the progression of the periodic signal, repeatedly sampling and therby measuring the progression of the periodic signal by producing secondary electron signals by applying an electron beam to the measuring point while gating the electron beam in synchronism with the periodic signal to produce electron beam pulses having a varying phase relation relative to the phase of the periodic signal and with a spacing of the electron beam pulses which is greater than the decay time of the secondary electron signals; and storing the individual secondary electron signals in chronological succession.

2. The improved method of claim 1, wherein the step of gating is further defined as:

gating the electron beam to produce electron beam pulses of constant spacing while shifting the phase of the electron beam pulses over phase regions whose individual sizes correspond to the overall phase region divided by the electron beam pulses of the period of the periodic signal.

3. The improved method of claim 1, and further comprising the steps of:

reading the stored signals in individual chronological succession; and recording the read signals.

4. The improved method of claim 3, wherein the step of recording is further defined as:

recording the read signals with an oscilloscope.

5. The improved method of claim 3, wherein the step of recording is further defined as:

recording the read signals with an x-y recorder.

* * * * *